United States Patent
Chiu et al.

(10) Patent No.: US 7,196,425 B2
(45) Date of Patent: Mar. 27, 2007

(54) COPPER INTERPOSER FOR REDUCING WARPING OF INTEGRATED CIRCUIT PACKAGES AND METHOD OF MAKING IC PACKAGES

(75) Inventors: Anthony M. Chiu, Richardson, TX (US); Tong Yan Tee, Singapore (SG)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/954,630

(22) Filed: Sep. 30, 2004

(65) Prior Publication Data

US 2006/0071345 A1    Apr. 6, 2006

(51) Int. Cl.
    *H01L 23/48* (2006.01)
(52) U.S. Cl. .............. 257/777; 257/778; 257/E27.137; 257/E27.144; 257/E27.161
(58) Field of Classification Search ............ 257/777, 257/778, E27.137, E27.144, E27.161
See application file for complete search history.

(56) References Cited

U.S. PATENT DOCUMENTS

| | | | |
|---|---|---|---|
| 6,335,491 B1 * | 1/2002 | Alagaratnam et al. | 174/260 |
| 6,376,904 B1 | 4/2002 | Haba et al. | |
| 6,444,921 B1 * | 9/2002 | Wang et al. | 174/260 |
| 6,627,990 B1 * | 9/2003 | Shim et al. | 257/712 |
| 6,773,958 B1 * | 8/2004 | Wang | 438/108 |
| 6,977,439 B2 * | 12/2005 | Kang et al. | 257/777 |
| 2002/0175401 A1 | 11/2002 | Huang et al. | |
| 2003/0062628 A1 | 4/2003 | Lee et al. | |
| 2003/0210533 A1 | 11/2003 | Baek et al. | |
| 2004/0084760 A1 | 5/2004 | Liu et al. | |
| 2004/0163240 A1 * | 8/2004 | Frezza | 29/832 |
| 2004/0201088 A1 * | 10/2004 | Kim et al. | 257/686 |

* cited by examiner

*Primary Examiner*—Andy Huynh
(74) *Attorney, Agent, or Firm*—Lisa K. Jorgenson; William A. Munck

(57) ABSTRACT

A stacked die integrated circuit assembly comprising: 1) a substrate; 2) a first integrated circuit die mounted on the substrate; 3) a copper interposer mounted on the first integrated circuit die; and 4) a second integrated circuit die mounted on the copper interposer. The copper interposer significantly reduces the warping of the stacked die IC assembly caused by the warping of the substrate due to thermal changes in the substrate. The copper interposer has a significantly higher coefficient of thermal expansion than a conventional silicon (Si) interposer. The higher CTE enables the copper interposer to counteract the substrate warping.

20 Claims, 2 Drawing Sheets

COPPER INTERPOSER FOR REDUCING WARPING OF INTEGRATED CIRCUIT PACKAGES AND METHOD OF MAKING IC PACKAGES

TECHNICAL FIELD OF THE INVENTION

The present invention relates generally to integrated circuit (IC) packages and, more specifically, to a stacked die ID package using a copper interposer to reduce warping of a substrate.

BACKGROUND OF THE INVENTION

The size of integrated circuit (IC) packages continues to decrease even as the complexity and level of circuit integration in the IC packages continue to increase. This is particularly true in the case of system-on-a-chip (SoC) devices, in which most, if not all, of an electronic appliance is integrated onto a single integrated circuit (IC) die. Thus, relatively complex devices, such as cell phones, network interface cards (NICs), communication buses, and the like, are now being implemented as a single integrated circuit or perhaps only several integrated circuits.

In addition to packing as many circuits as possible onto a single integrated circuit (IC) die, manufacturers are also packing as many IC dies as possible onto circuit board. In order to further this objective, manufactures place IC dies as close together as possible on a substrate to thereby increase IC die density. However, in some designs, manufacturers also stack IC dies vertically in order to improve the packing density of the integrated circuit dies.

In a stacked chip arrangement, a first IC die is mounted on a substrate by means of, for example, a solder ball grid array (BGA). Next, a silicon (Si) interposer mounted on top of the first IC die by means of an attachment layer, such as an adhesive layer or die attach. A second IC die is then mounted on top of the silicon interposer by means of another attachment layer (i.e., another adhesive layer/die attach). Additional IC dies and silicon interposers may subsequently be added to the stack to further improve packing density. Such a stack of IC chips may be implemented on an open substrate or within a sealed IC package.

However, as IC dies are packed more closely and lead lines become ever smaller, some well-known problems associated with IC manufacturing become aggravated. The cracking of solder joints connecting IC dies to substrates may cause a circuit board assembly to become defective. Thus, it is desirable to maintain a high level of solder joint reliability (SJR).

But, solder joints frequently crack due to thermal stresses encountered during manufacturing or during operation. Alternate cycles of heating and cooling may cause the substrate to warp, particularly as a result of shrinkage that occurs as the substrate cools. The coefficient of thermal expansion (CTE) of a silicon die is significantly less than the CTE of a substrate. The solder joints of a ball grid array connecting an IC die to a substrate are very fine. As the substrate warps, some of the solder joints may crack, thereby causing defects. This substrate warping is particularly damaging to stacked assemblies of integrated circuit dies.

There exists a need in the art for integrated circuit (IC) devices that have improved solder joint reliability. In particular, there is a need in the art to reduce warping of stacked die integrated circuit (IC) packages caused by the warping of the substrate due to thermal changes in the substrate.

SUMMARY OF THE INVENTION

To address the above-discussed deficiencies of the prior are, the present invention provides a copper interposer that reduces the warping of a stacked die integrated circuit (IC) package caused by the warping of the substrate due to thermal changes in the substrate. The copper (Cu) interposer has a significantly higher coefficient of thermal expansion (CTE) than a conventional silicon (Si) interposer. The higher CTE enables the copper interposer to counteract the substrate shrinkage more effectively.

It is a primary object of the present invention to provide a stacked die integrated circuit assembly comprising: 1) a substrate; 2) a first integrated circuit die mounted on the substrate; 3) a copper interposer mounted on the first integrated circuit die; and 4) a second integrated circuit die mounted on the copper interposer.

According to the principles of the present invention, a coefficient of thermal expansion associated with the copper interposer is more closely matched to a coefficient of thermal expansion of the substrate than a coefficient of thermal expansion of a silicon interposer.

It is another primary object of the present invention to provide a method of fabricating a stacked die integrated circuit assembly. The method comprises the steps of 1) attaching a lower surface of a first integrated circuit die to a substrate; 2) attaching a lower surface of a copper interposer to an upper surface of the first integrated circuit die; and 3) attaching a lower surface of a second integrated circuit die to an upper surface of the copper interposer.

According to one embodiment of the present invention, the lower surface of the first integrated circuit die is attached to the substrate using a solder ball grid array, the lower surface of the copper interposer is attached to the upper surface of the first integrated circuit die using a first adhesive layer, and the lower surface of the second integrated circuit die is attached to the upper surface of the copper interposer using a second adhesive layer.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; and the term "or" is inclusive, meaning and/or. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior uses, as well as to future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged stacked die integrated circuit assembly.

Figure 1:
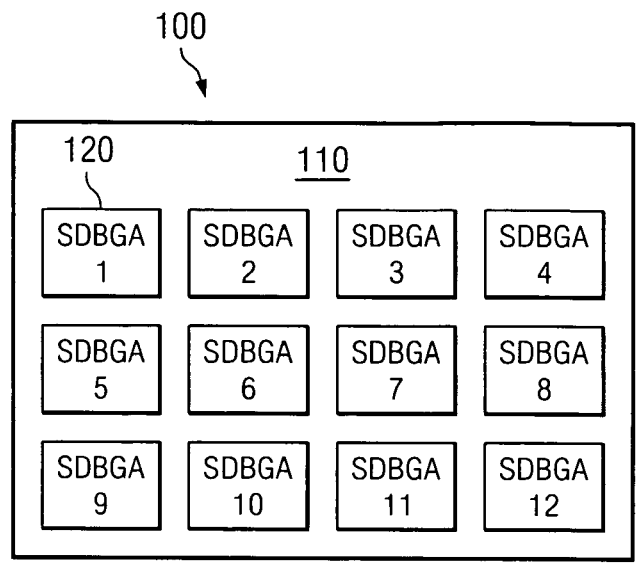
FIG. 1 illustrates a top view of an exemplary electronic assembly board on which is disposed stacked die integrated circuits according to the principles of the present invention.

FIG. 1 is a top view of exemplary electronic assembly board 100, on which is disposed a plurality of stacked die integrated circuits according to the principles of the present invention. Electronic assembly board 100 comprises substrate 110, which provides support and electrical connections for a block of stacked die ball grid array (SDBGA) integrated circuit assemblies, which are arbitrarily labeled SDBGA 1 through SDBGA 12, respectively. Stacked die integrated circuit (IC) assembly 120, labeled SDBGA 1, is a representative one of SDGA 1 through SDBGA 12.

Stacked die IC assembly 120 comprises one or more silicon (Si) dies (or wafers) that are vertically stacked on substrate 110. A first silicon IC die is attached to substrate 110 by means of a grid array of solder balls that also provide electrical connection paths between electronic pads on the lower surface of the first silicon IC die and electronic pads on the upper surface of substrate 110.

A copper interposer according to the present invention is then mounted on the upper surface of the first silicon IC day by means of a die attach (or adhesive layer). Additional layers of IC dies an interposers may also be added.

The use of a copper interposer in lieu of a silicon interposer improves solder joint reliability (SJR) by reducing the warping of the substrate caused by thermal changes. The coefficient of thermal expansion (CTE) of a copper interposer (e.g., 17.7 ppm/° C.) is much greater than the CTE of a silicon interposer (e.g., 2.8 ppm/° C.). The higher CTE of copper is much closer to the CTE of a typical substrate (e.g., 18 ppm/° C.). This helps to counteract the substrate shrinkage.

Figure 2A:
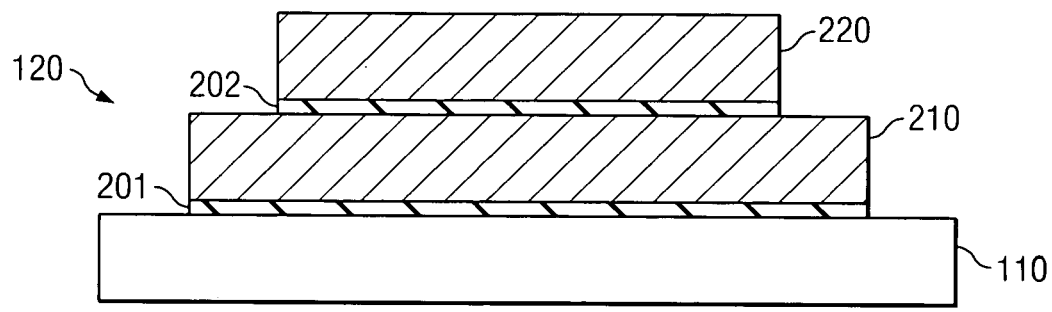
FIG. 2A illustrates a cross-sectional view of an exemplary stacked die integrated circuit using only a single die according to one embodiment of the present invention.

FIG. 2A is a cross-sectional view of an exemplary stacked die integrated circuit (IC) assembly 120 that uses only a single die according to one embodiment of the present invention. Stacked die IC assembly 120 comprises substrate 110, silicon (Si) integrated circuit (IC) die 210, and copper (Cu) interposer 220. Silicon IC die 210 is mounted on substrate 110 by means of solder ball grid array 201. Copper interposer 220 is mounted on silicon IC die 210 by means of adhesive layer 202 (i.e., a die attach layer).

Even though only a single silicon IC die is shown in FIG. 2A, copper interposer 220 still reduces warping of substrate 110 due to thermal change. Additional silicon IC dies may subsequently be mounted on the upper surface of copper interposer 220.

Figure 2B:
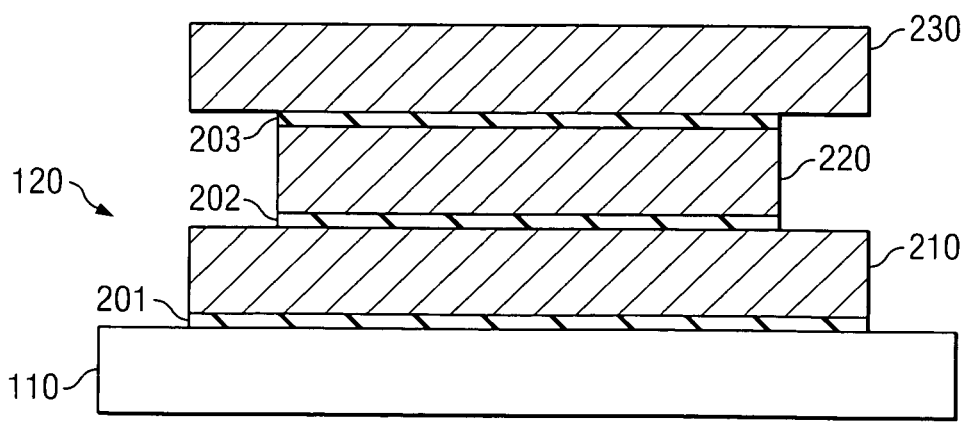
FIG. 2B illustrates a cross-sectional view of an exemplary stacked die integrated circuit using two dies according to another embodiment of the present invention.

FIG. 2B is a cross-sectional view of an exemplary stacked die integrated circuit (IC) assembly 120 using two dies according to another embodiment of the present invention. Stacked die IC assembly 120 comprises substrate 110, silicon (Si) integrated (IC) die 210, copper (Cu) interposer 220, and silicon (Si) integrated (IC) assembly 230. As in FIG. 2A, silicon IC die 210 is mounted on substrate 110 by means of solder ball grid array 201 and copper interposer 220 is mounted on silicon IC die 210 by means of adhesive layer 202 ((i.e., die attach). Furthermore, silicon IC die 230 is mounted on copper interposer 220 by means of adhesive layer 203. Additional layers of copper interposers and silicon IC dies may subsequently be mounted on the upper surface of silicon IC die 230.

Figure 3:
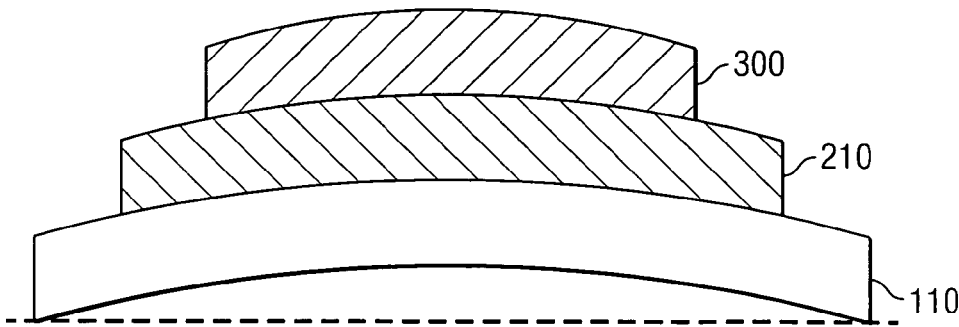
FIG. 3 illustrates the warping of an exemplary stacked die integrated circuit assembly containing a PRIOR ART silicon interposer.
Figure 4:
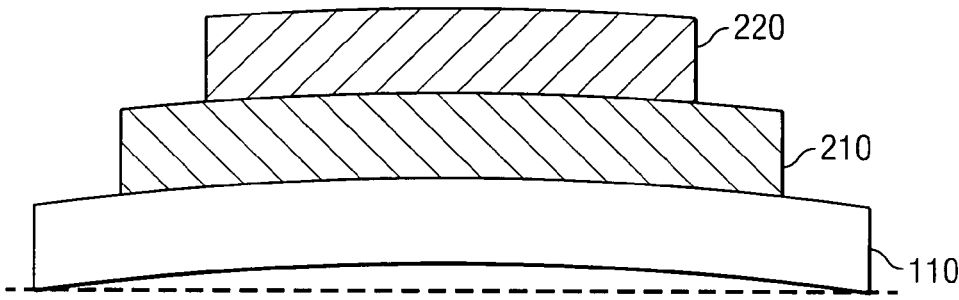
FIG. 4 illustrates the warping of an exemplary stacked die assembly containing a copper interposer according to the principles of the present invention.

FIG. 3 illustrates the warping of an exemplary stacked die integrated circuit assembly containing PRIOR ART silicon (Si) interposer 300. FIG. 4 illustrates warping of an exemplary stacked die assembly containing copper interposer 220 according to the principles of the present invention. The components illustrated in FIGS. 3 and 4 are not intended to be drawn to scale. The dotted lines in FIGS. 3 and 4 are straight lines indicating the relative amounts of warping that occur with a silicon interposer and a copper interposer. FIGS. 3 and 4 are intended to illustrate that there is relatively less warping (or warpage) of the substrate and integrated circuit die when copper interposer 220 is used (in FIG. 4) than when silicon interposer 300 is used (FIG. 3).

Figure 5:
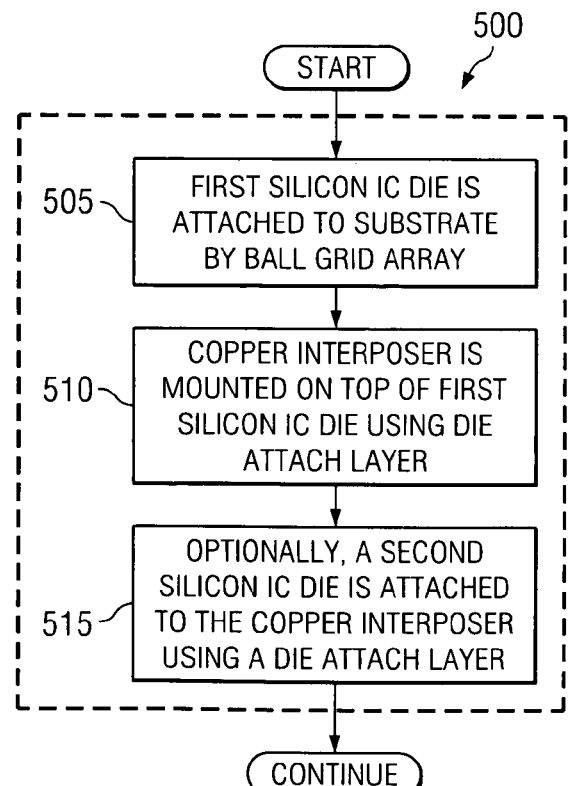
FIG. 5 is a flow diagram illustrating an exemplary process for making a stacked die assembly containing a copper interposer according to the principles of the present invention.

FIG. 5 depicts flow diagram 500, which illustrates an exemplary process for making a stacked die assembly containing a copper interposer according to the principles of the present invention. Initially, a first silicon IC die is mounted on a substrate by means of a solder ball grid array (or any other similar or suitable interconnection layer; process step 505). Next, a copper interposer is mounted on the first silicon IC die by means of a die attach layer (process step 510). If required, a second silicon IC die is mounted on top of the copper interposer by means of another die attach layer (process step 515). Process steps 510 and 515 may then be repeated for additional layers of interposers and silicon IC dies.

Although the present invention has been described in detail, those skilled in the art will understand that various changes, substitutions, and alterations herein may be made without departing from the spirit and scope of the invention it its broadest form.

What is claimed is:

1. A stacked die integrated circuit assembly comprising:
   a substrate;
   a first integrated circuit die mounted on said substrate;
   a copper interposer mounted on said first integrated circuit die; and
   a second integrated circuit die mounted on said copper interposer;
   wherein the copper interposer is sized and positioned such that expansion and shrinkage of the copper interposer caused by heating and cooling of the copper interposer by one or more of the integrated circuit dies at least partially reduces warpage of the substrate caused by heating and cooling of the substrate by one or more of the integrated circuit dies.

2. The stacked integrated circuit assembly as set forth in claim 1, wherein a coefficient of thermal expansion associated with said copper interposer is closely matched to a coefficient of thermal expansion of said substrate.

3. A stacked die integrated circuit assembly comprising:
a substrate;
a first integrated circuit die mounted on said substrate; and
a copper interposer mounted on said first integrated circuit die;
wherein the copper interposer is sized and positioned such that expansion and shrinkage of the copper interposer caused by heating and cooling of the copper interposer by the first integrated circuit die at least partially reduces warpage of the substrate caused by heating and cooling of the substrate by the first integrated circuit die.

4. The stacked die integrated circuit assembly as set forth in claim 3, wherein a coefficient of thermal expansion associated with said copper interposer is closely matched to a coefficient of thermal expansion of said substrate.

5. An electronic circuit assembly comprising:
a printed circuit board (PCB) substrate; and
a plurality of stacked die integrated circuit assemblies mounted on said PCB substrate, wherein each of said plurality of stacked die integrated circuit assemblies comprises:
a first integrated circuit die mounted on said PCB substrate;
a copper interposer mounted on said first integrated circuit die; and
a second integrated circuit die mounted on said copper interposer;
wherein the copper interposer is sized and positioned such that expansion and shrinkage of the copper interposer caused by heating and cooling of the copper interposer by one or more of the integrated circuit dies at least partially reduces warpage of the PCB substrate caused by heating and cooling of the PCB substrate by one or more of the integrated circuit dies.

6. The electronic circuit assembly as set forth in claim 5, wherein a coefficient of thermal expansion associated with said copper interposer is closely matched to a coefficient of thermal expansion of said PCB substrate.

7. An electronic circuit assembly comprising:
a printed circuit board (PCB) substrate; and
a plurality of stacked die integrated circuit assemblies mounted on said PCB substrate, wherein each of said plurality of stacked die integrated circuit assemblies comprises:
a first integrated circuit die mounted on said PCB substrate; and
a copper interposer mounted on said first integrated circuit die;
wherein the copper interposer is sized and positioned such that expansion and shrinkage of the copper interposer caused by heating and cooling of the copper interposer by the first integrated circuit die at least partially reduces warpage of the PCB substrate caused by heating and cooling of the PCB substrate by the first integrated circuit die.

8. The electronic circuit assembly as set forth in claim 7, wherein a coefficient of thermal expansion associated with said copper interposer is closely matched to a coefficient of thermal expansion of said PCB substrate.

9. A method of fabricating a stacked die integrated circuit assembly comprising the steps of:
attaching a lower surface of a first integrated circuit die to a substrate; and
attaching a lower surface of a copper interposer to an upper surface of the first integrated circuit die;
wherein the copper interposer is sized and positioned such that expansion and shrinkage of the copper interposer caused by heating and cooling of the copper interposer by the first integrated circuit die at least partially reduces warpage of the substrate caused by heating and cooling of the substrate by the first integrated circuit die.

10. The method of fabricating a stacked die integrated circuit assembly as set forth in claim 9, wherein the lower surface of the first integrated circuit die is attached to the substrate using a solder ball grid array.

11. The method of fabricating a stacked die integrated circuit assembly as set forth in claim 10, wherein the lower surface of the copper interposer is attached to the upper surface of the first integrated circuit die using a first adhesive layer.

12. The method of fabricating a stacked die integrated circuit assembly as set forth in claim 11, further comprising the step of attaching a lower surface of a second integrated circuit die to an upper surface of the copper interposer, and wherein the lower surface of the second integrated circuit die is attached to the upper surface of the copper interposer using a second adhesive layer.

13. The method of fabricating a stacked die integrated circuit assembly as set forth in claim 9, further comprising the step of attaching a lower surface of a second integrated circuit die to an upper surface of the copper interposer.

14. The method of fabricating a stacked die integrated circuit assembly as set forth in claim 9, wherein a coefficient of thermal expansion associated with the copper interposer is closely matched to a coefficient of thermal expansion of the substrate.

15. The method of fabricating a stacked die integrated circuit assembly as set forth in claim 9, wherein a coefficient of thermal expansion associated with the copper interposer and a coefficient of thermal expansion of the substrate differ by less than 1 ppm/° C.

16. The stacked die integrated circuit assembly as set forth in claim 1, wherein a coefficient of thermal expansion associated with the copper interposer and a coefficient of thermal expansion of the substrate differ by less than 1 ppm/° C.

17. The stacked die integrated circuit assembly as set forth in claim 3, wherein a coefficient of thermal expansion associated with the copper interposer and a coefficient of thermal expansion of the substrate differ by less than 1 ppm/° C.

18. The electronic circuit assembly as set forth in claim 5, wherein a coefficient of thermal expansion associated with the copper interposer and a coefficient of thermal expansion of the PCB substrate differ by less than 1 ppm/° C.

19. The electronic circuit assembly as set forth in claim 7, wherein a coefficient of thermal expansion associated with the copper interposer and a coefficient of thermal expansion of the PCB substrate differ by less than 1 ppm/° C.

20. The electronic circuit assembly as set forth in claim 7, wherein the copper interposer is substantially formed of copper only.

* * * * *